United States Patent
Pei et al.

(10) Patent No.: US 8,642,440 B2
(45) Date of Patent: Feb. 4, 2014

(54) CAPACITOR WITH DEEP TRENCH ION IMPLANTATION

(75) Inventors: Chengwen Pei, Hopewell Junction, NY (US); Roger Allen Booth, Jr., Hopewell Junction, NY (US); Herbert Lei Ho, Hopewell Junction, NY (US); Naoyoshi Kusaba, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 71 days.

(21) Appl. No.: 13/279,877

(22) Filed: Oct. 24, 2011

(65) Prior Publication Data

US 2013/0099354 A1   Apr. 25, 2013

(51) Int. Cl.
*H01L 21/20* (2006.01)

(52) U.S. Cl.
USPC .......................................... 438/386; 438/957

(58) Field of Classification Search
USPC .................................. 438/957, 386
See application file for complete search history.

(56) References Cited

U.S. PATENT DOCUMENTS

| | | | |
|---|---|---|---|
| 5,429,972 | A | 7/1995 | Anjum et al. |
| 5,662,768 | A | 9/1997 | Rostoker |
| 6,159,874 | A | 12/2000 | Tews et al. |
| 6,177,696 | B1 | 1/2001 | Bronner et al. |
| 6,417,064 | B1 | 7/2002 | Lin et al. |
| 6,632,721 | B1 | 10/2003 | Iijima et al. |
| 6,806,138 | B1 | 10/2004 | Cheng et al. |
| 2009/0170331 | A1 | 7/2009 | Cheng et al. |

FOREIGN PATENT DOCUMENTS

GB   2238909 A   6/1991

*Primary Examiner* — Douglas Menz
(74) *Attorney, Agent, or Firm* — Joseph P. Abate; Howard M. Cohn (57) ABSTRACT

An improved semiconductor capacitor and method of fabrication is disclosed. Embodiments utilize a deep trench which is then processed by performing a pre-amorphous implant on the trench interior to transform the interior surface of the trench to amorphous silicon which eliminates the depletion region that can degrade capacitor performance.

11 Claims, 8 Drawing Sheets

CAPACITOR WITH DEEP TRENCH ION IMPLANTATION

FIELD OF THE INVENTION

The present invention relates generally to semiconductors, and more particularly, to semiconductor capacitors, and methods of fabrication.

BACKGROUND OF THE INVENTION

A DRAM cell is essentially a capacitor for storing charge and a pass transistor (also called a pass gate or access transistor) for transferring charge to and from the capacitor. Data stored in the cell is determined by the absence or presence of charge on the storage capacitor. Because cell size affects chip density, and cost, reducing cell area is one of the DRAM designer's primary goals.

One way to accomplish this density goal without sacrificing storage capacitance is to use trench capacitors in the cells. Trench capacitors can be formed by etching deep trenches in a silicon wafer and forming vertically oriented capacitors within each deep trench. Thus, the surface area required for the storage capacitor is dramatically reduced without sacrificing capacitance, and correspondingly, storable charge.

Trench-type memory devices are advantageous, in comparison to planar memory configurations, for increased density, performance and lithographic considerations. Trench-type memory devices increase density by reducing the cell area of each memory device, therefore allowing for closer positioning of adjacent memory devices.

As the trend towards miniaturization increases, so does the performance demands of electronic devices, it is desirable to have an improved DRAM and method of fabrication.

SUMMARY

In one embodiment, the present invention provides a method of forming a trench capacitor. The method comprises forming a trench having an interior surface in a semiconductor substrate; performing a pre-amorphous ion process on the interior surface of the trench; forming a buried plate around the trench; depositing a node dielectric along the interior surface of the trench; and filling the trench with a conductive material.

In another embodiment, the present invention provides a capacitor. The capacitor comprises a trench formed in a semiconductor substrate comprised of crystalline silicon. The trench has an interior surface comprised of amorphous silicon. There is a buried plate disposed around the trench. There is a node dielectric disposed along the interior surface of the trench, and a conductive material filling the trench. In another embodiment, the present invention provides a capacitor. The capacitor comprises a trench formed in a semiconductor substrate comprised of crystalline silicon, the trench having an interior surface comprised of amorphous silicon. There is a buried plate disposed around the trench. There is a conductive layer disposed along the interior surface of the trench. There is a node dielectric disposed on the conductive layer, and a conductive material filling the trench. No depletion region exists between the node dielectric and the buried plate.

BRIEF DESCRIPTION OF THE DRAWINGS

The structure, operation, and advantages of the present invention will become further apparent upon consideration of the following description taken in conjunction with the accompanying figures (FIGs.). The figures are intended to be illustrative, not limiting.

Certain elements in some of the figures may be omitted, or illustrated not-to-scale, for illustrative clarity. The cross-sectional views may be in the form of "slices", or "near-sighted" cross-sectional views, omitting certain background lines which would otherwise be visible in a "true" cross-sectional view, for illustrative clarity.

Often, similar elements may be referred to by similar numbers in various figures (FIGs) of the drawing, in which case typically the last two significant digits may be the same, the most significant digit being the number of the drawing figure (FIG).

DETAILED DESCRIPTION

Figure 1:
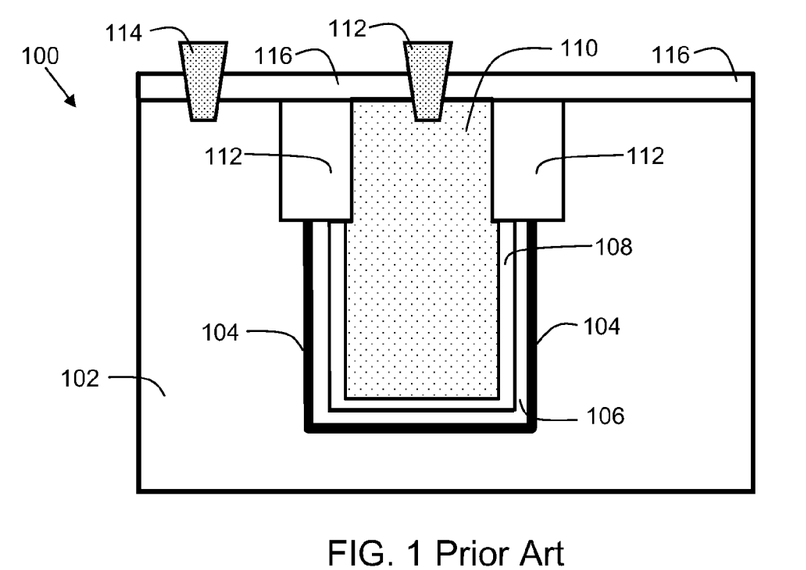
FIG. 1 shows a prior art trench capacitor.

In order to provide context for embodiments of the present invention, a prior art trench capacitor 100 is shown in FIG. 1 and briefly described. A trench is formed in a silicon substrate 102. The trench is filled with polysilicon 110, forming the anode of the capacitor. A buried plate 104 forms the cathode of the capacitor. A node dielectric layer 108 separates the polysilicon 110 (anode) from the buried plate 104 (cathode). A shallow trench isolation (STI) region 112 is disposed around an upper portion of the trench.

Above the substrate 102, an interlayer dielectric (ILD) film 116 is deposited. Anode contact 112 and cathode contact 114 traverse the ILD film 116. Contacts 112 and 114 allow the capacitor to be connected to other elements, such as transistors, to form electronic circuits. Buried plate 104 is formed via ion implantation. This causes an undesirable depletion region 106 to form between node dielectric layer 108 and buried plate 104. The depletion region 106 acts as a parasitic series capacitance that reduces the overall capacitance of the trench capacitor. For semiconductor performance, in particular for DRAM applications, it is desirable to have increased capacitance.

Hence, the depletion region reduces semiconductor performance in many instances. Embodiments of the present invention reduce or effectively eliminate the depletion region to allow for increased capacitance for a trench capacitor of a given size, allowing for improved semiconductor performance for applications such as DRAM devices.

Figure 2:
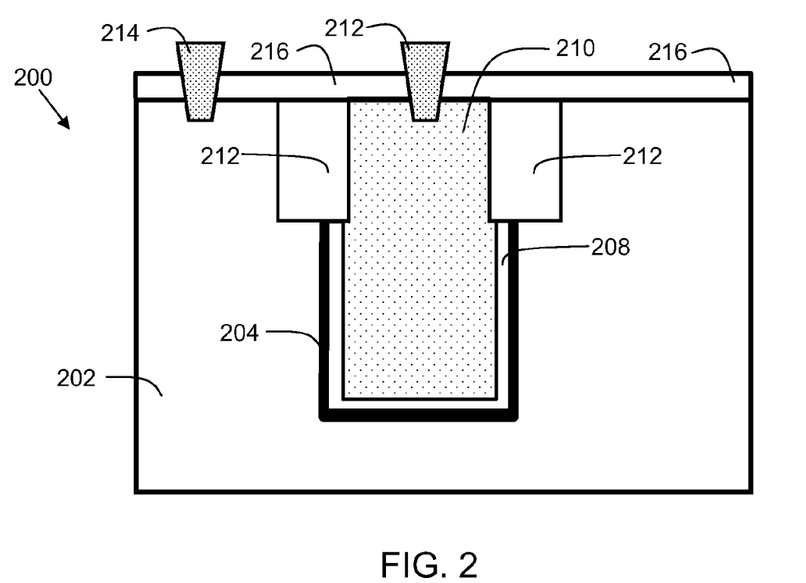
FIG. 2 shows a trench capacitor in accordance with an embodiment of the present invention.

FIG. 2 shows a trench capacitor 200 in accordance with an embodiment of the present invention. As mentioned previously, similar elements may be referred to by similar numbers in various figures (FIGs) of the drawing, in which case typically the last two significant digits may be the same, the most significant digit being the number of the drawing figure (FIG). For example, substrate 202 of FIG. 2 is similar to substrate 102 of FIG. 1, and STI region 212 of FIG. 2 is similar to STI region 112 of FIG. 1, etc. . . . A difference between trench capacitor 200 of FIG. 2 and trench capacitor 100 of FIG. 1 is that there is no depletion region in the trench capacitor 200 of FIG. 2 (compare with 106 of FIG. 1). For trench capacitor 200, the node dielectric layer 208 is in contact with buried plate 204, with no intervening depletion region. Therefore, for a given dimension, trench capacitor 200 has a higher capacitance than trench capacitor 100 (of FIG. 1) due to the elimination of the depletion region.

Figure 3:
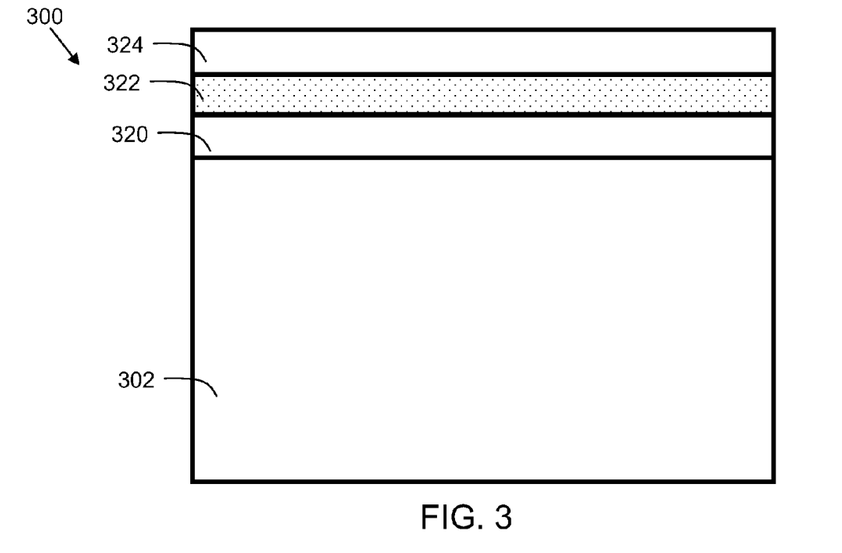
FIG. 3 shows a semiconductor structure at a starting point for a method in accordance with an embodiment of the present invention.

FIG. 3 shows a semiconductor structure 300 at a starting point for a method in accordance with an embodiment of the present invention. Semiconductor structure 300 comprises a substrate 302, which may be comprised of crystalline silicon. Disposed above substrate 302 is pad film 320. In one embodiment, pad film 320 may be comprised of a nitride or oxide layer. Disposed above pad film 320 is a boro-silicate glass (BSG) layer 322. BSG layer 322 serves as a hard mask during the reactive ion etch (RIE) into the substrate 302 during the formation of deep trenches. In some embodiments, the trench depth etched by the RIE process may be in the range of 1 to 10 microns. The BSG layer 322 serves to protect the substrate 302 during the RIE process. Disposed above BSG layer 322 is photo-resist (PR) layer 324.

Figure 4:
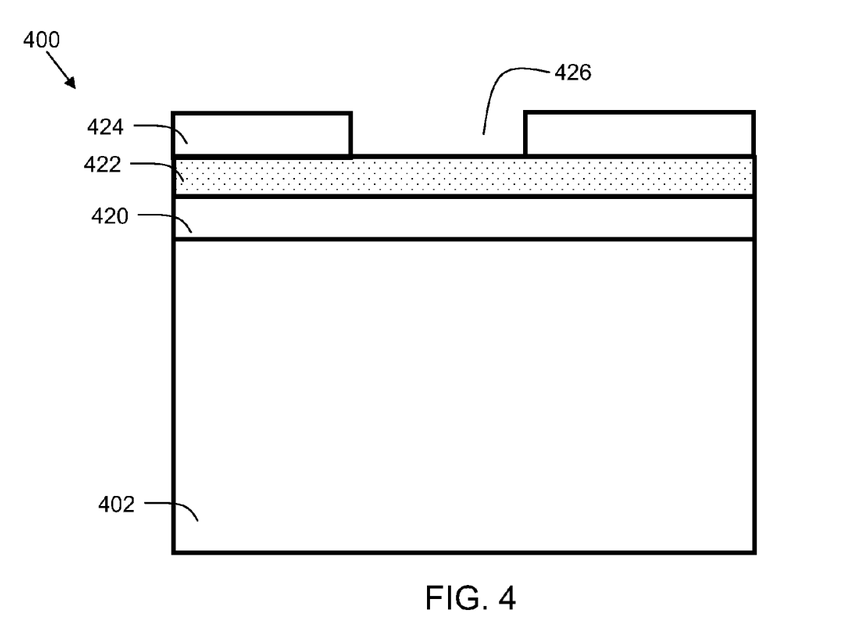
FIG. 4 shows a semiconductor structure after a process step of patterning a photoresist layer.

FIG. 4 shows a semiconductor structure 400 after a process step of patterning a PR layer 424 using standard lithographic methods, forming opening 426 which exposes a portion of BSG layer 422.

Figure 5:
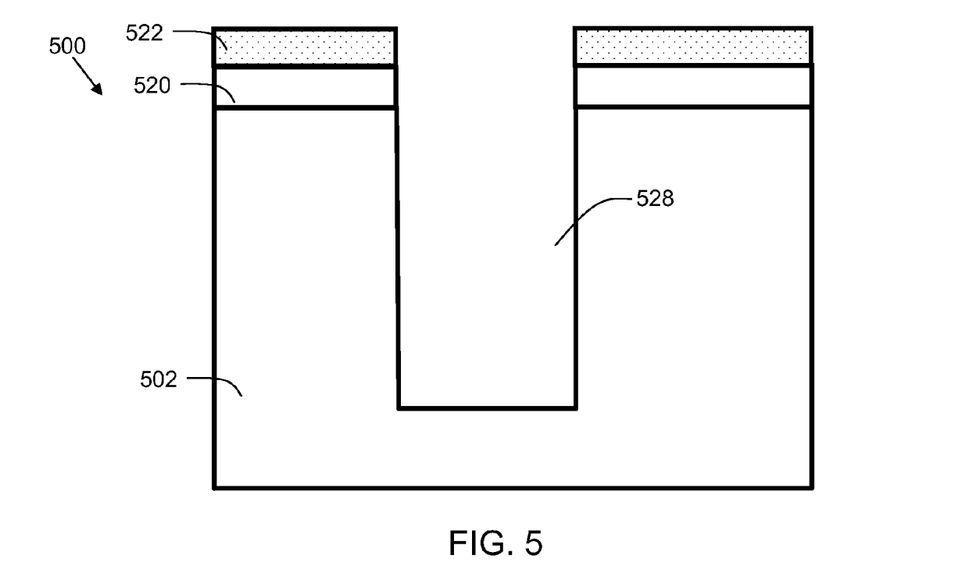
FIG. 5 shows a semiconductor structure after a process step of trench formation.

FIG. 5 shows a semiconductor structure 500 after the formation of trench 528. The formation of the trench 528 is performed with an anisotropic etch, such as by using a reactive ion etch (RIE) process.

Figure 6:
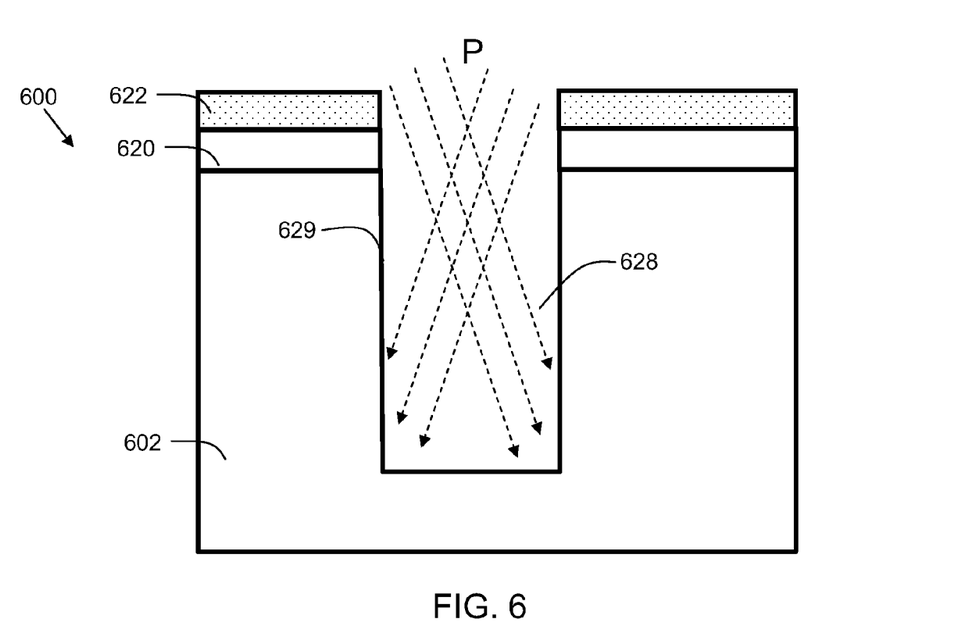
FIG. 6 shows a semiconductor structure during the process step of pre-amorphous ion processing of the trench.

FIG. 6 shows a semiconductor structure 600 during the process step of pre-amorphous ion (PAI) processing of the interior surface 629 of trench 628. The pre-amorphous ion process, represented by lines "P" is performed to "damage" or alter the crystalline structure of substrate 602 along the interior surface 629 of trench 628. In one embodiment, the PAI process is performed with a neutral species, which may include germanium or xenon, or other species serving a similar purpose. In another embodiment, the PAI process is performed with carbon. The inventors have found that the use of carbon for the PAI process significantly increases the dopant concentration during subsequent formation of the buried plate. Carbon combines with silicon atoms much easier than other species, and this slows down the out-diffusion process of effective dopants such as phosphorus, arsenic, thereby achieving a higher dopant concentration.

Figure 7:
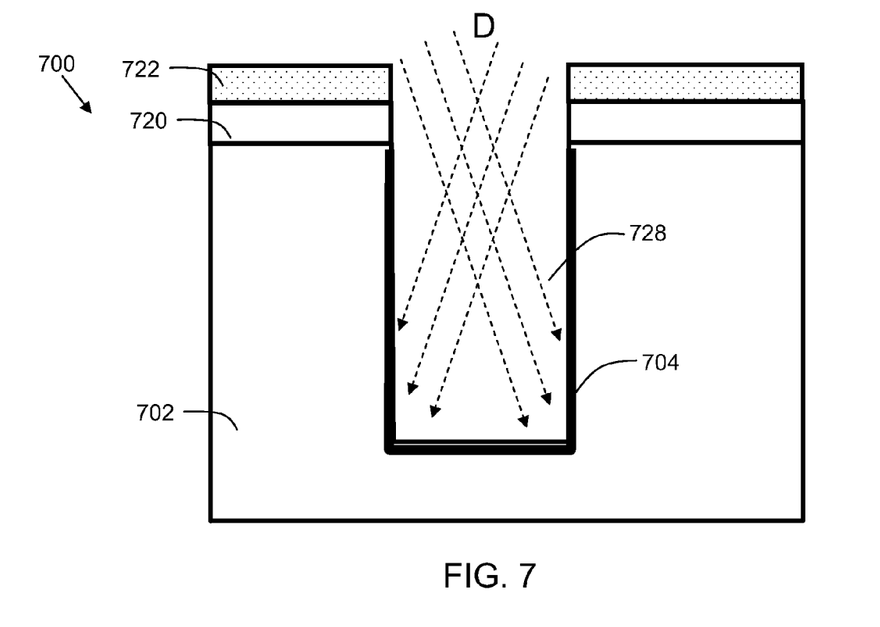
FIG. 7 shows a semiconductor structure during the process step of dopant ion implantation of the trench.

FIG. 7 shows a semiconductor structure 700 during the process step of dopant ion implantation of the trench. The dopant implanting, represented by lines "D" is performed to form buried plate 704 around trench 728. In one embodiment, the dopant species is arsenic. In another embodiment, the dopant species may be phosphorous. In one embodiment, the formation of buried plate 704 is performed using a dopant concentration ranging from about 1 e18/cm3 to about 1 e20/cm3 and an energy setting ranging from about 5 KeV to about 30 KeV.

Figure 8:
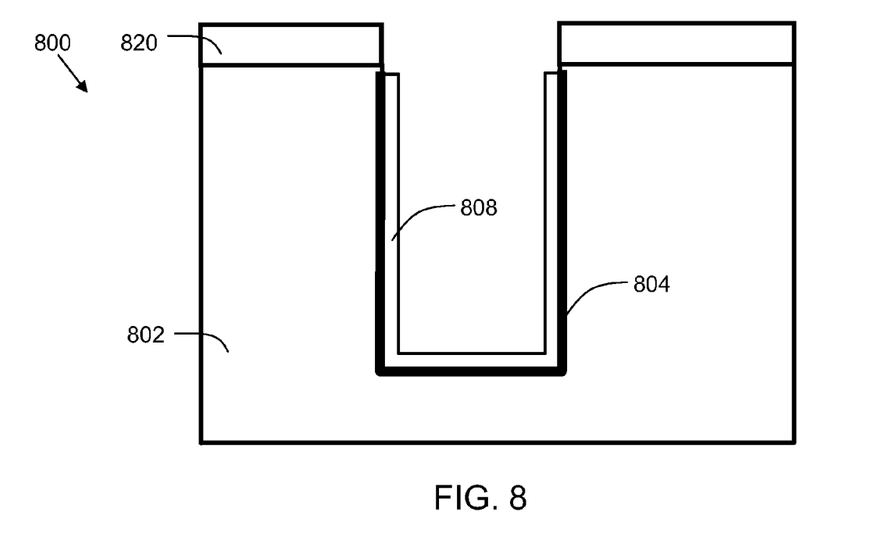
FIG. 8 shows a semiconductor structure after a process step of node dielectric deposition.

FIG. 8 shows a semiconductor structure 800 after a process step of BSG layer removal and node dielectric deposition. The BSG layer may be removed via chemical mechanical polish (CMP) and wet etching after node dielectric deposition. In one embodiment, the node dielectric layer 808 is comprised of hafnium oxide. In one embodiment, the node dielectric layer 808 is deposited via atomic layer deposition (ALD) or other deposition methods.

Figure 9:
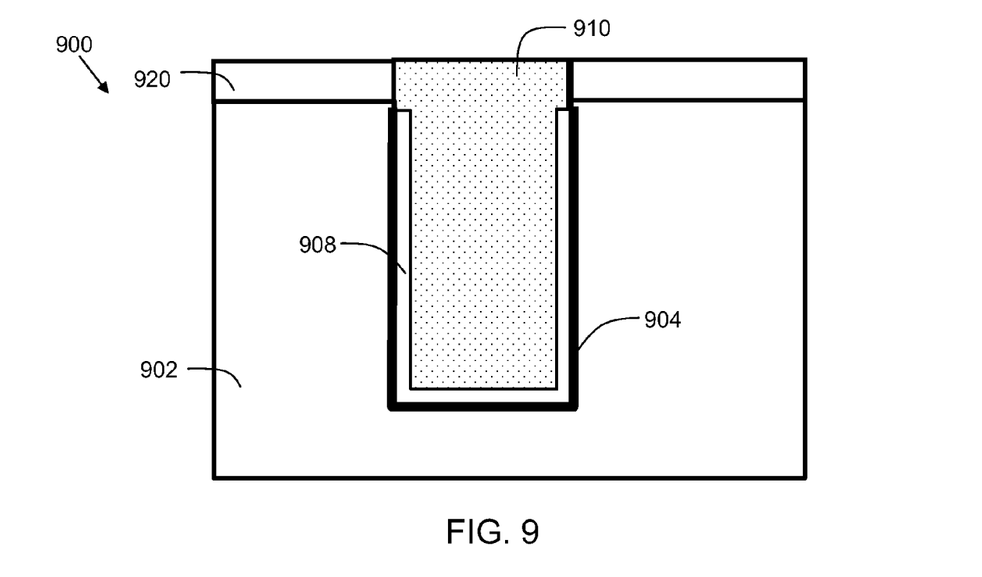
FIG. 9 shows a semiconductor structure after a process step of trench conductor fill.

FIG. 9 shows a semiconductor structure 900 after a process step of filling the trench with a trench conductor 910. In one embodiment, trench conductor 910 is comprised of polysilicon. In another embodiment, trench conductor 910 is comprised of metal, such as titanium. In one embodiment, trench conductor 910 is deposited via atomic layer deposition (ALD). In another embodiment, trench conductor 910 is deposited via chemical vapor deposition (CVD).

Figure 10:
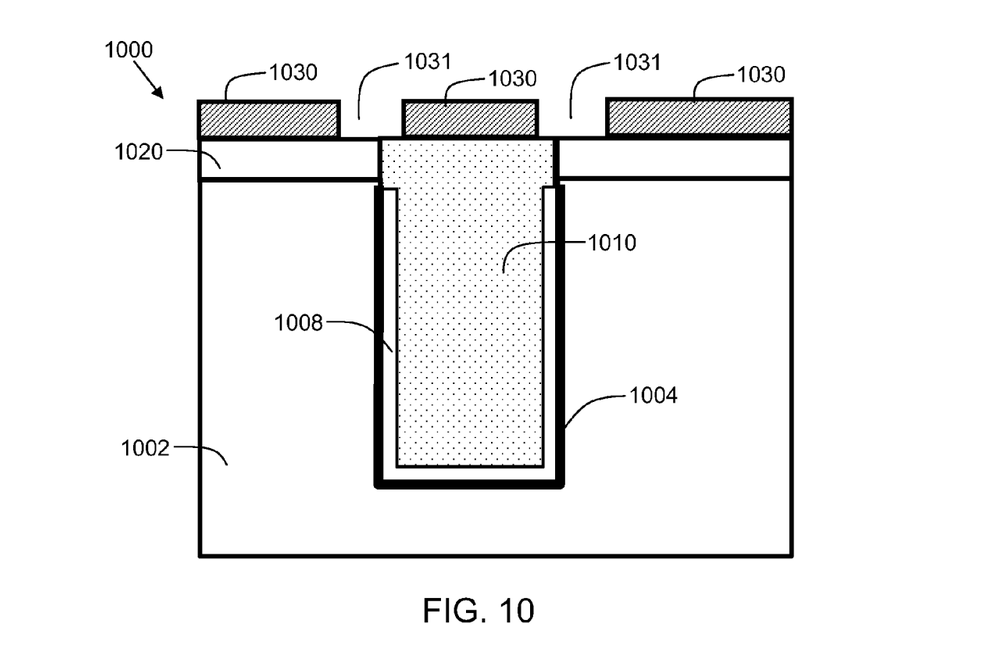
FIG. 10 shows a semiconductor structure after a process step of depositing and patterning a second photoresist layer.

FIG. 10 shows a semiconductor structure 1000 after a process step of depositing and patterning a second photoresist layer 1030. This is performed via standard methods for depositing and patterning photoresist (PR). As a result of the patterning, voids 1031 in the photoresist expose a portion of the pad film 1020.

Figure 11:
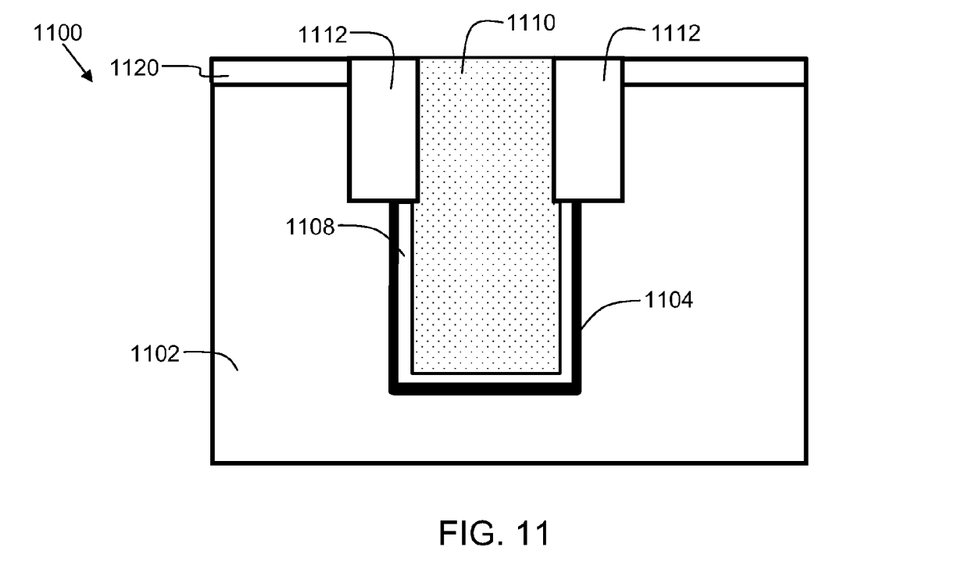
FIG. 11 shows a semiconductor structure after a process step of formation of shallow trench isolation regions.

FIG. 11 shows a semiconductor structure 1100 after a process step of formation of shallow trench isolation (STI) regions 1112 around the upper portion of the trench. The STI regions 1112 are formed by anisotropic etching of the areas exposed by the photoresist voids (1031 of FIG. 10). An insulator such as oxide is then deposited in the voids after the remaining photoresist (PR) is removed.

The next steps in the fabrication of the trench capacitor comprise depositing an interlayer dielectric (ILD), and forming metal contacts to allow the capacitor to be connected to other elements, such as transistors, to form electronic circuits. This is shown in FIG. 2, where the ILD layer 216 is disposed over the substrate 202, and anode contact 212 and cathode contact 214 traverse the ILD layer 216. The buried plate 204 is in contact with the node dielectric layer 208, with no depletion region between them, thereby increasing the capacitance of the trench capacitor.

Figure 12:
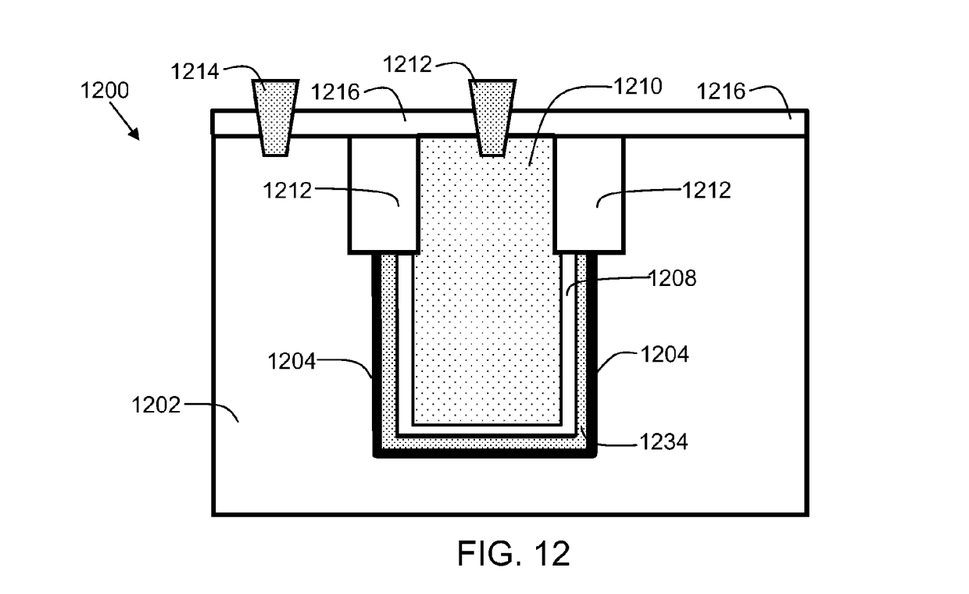
FIG. 12 shows a trench capacitor in accordance with another embodiment of the present invention.

FIG. 12 shows a trench capacitor 1200 in accordance with another embodiment of the present invention. Trench capacitor 1200 is similar to trench capacitor 200 of FIG. 2. However, trench capacitor 1200 further comprises additional conductive layer 1234 disposed between the buried plate 1204 and node dielectric layer 1208. The conductive layer 1234 may be a metal, such as titanium, or a silicide, such as nickel silicide (SiNi). Thus, trench capacitor 1200 is a metal-insulator-metal (MIM) capacitor with no depletion region. MIM capacitors are often well-suited for use as filter and analog capacitors in mixed-signal products, for example.

Figure 13:
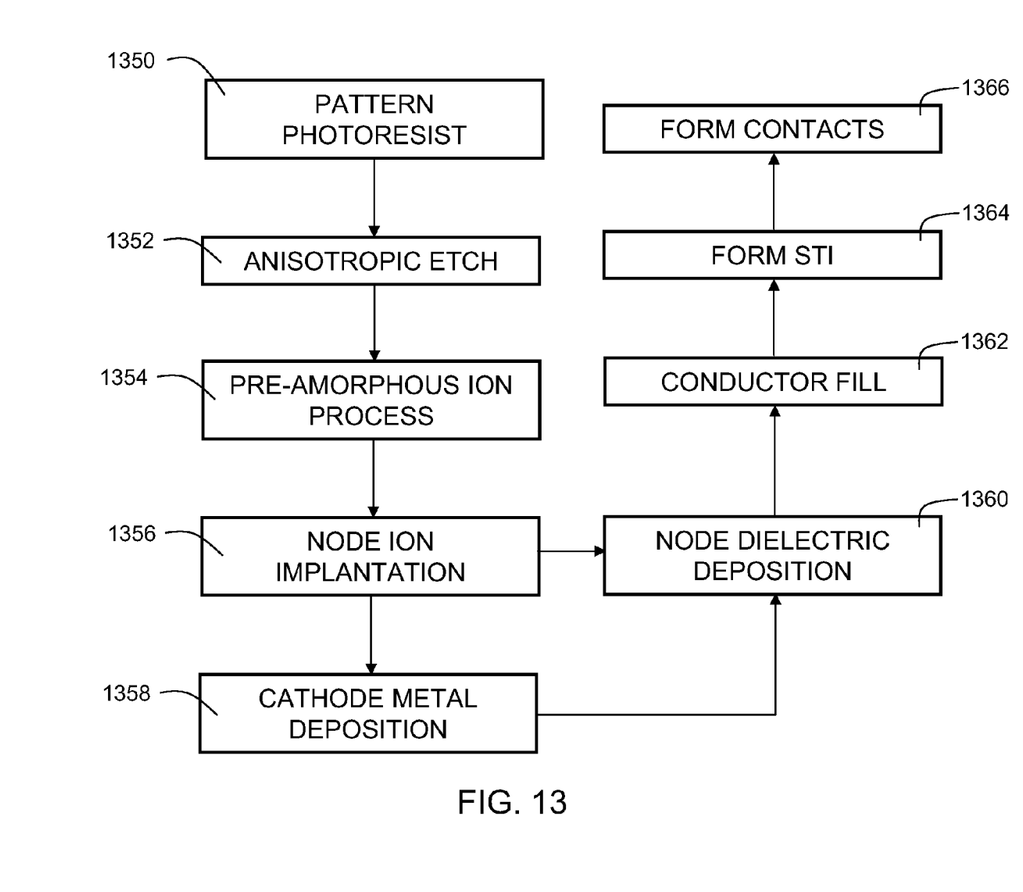
FIG. 13 is a flowchart indicating process steps for a method in accordance with an embodiment of the present invention.

FIG. 13 is a flowchart indicating process steps for a method in accordance with an embodiment of the present invention. In process step 1350, photoresist (PR) is patterned in the area where a trench is to be formed. This is shown in FIG. 4 (see 426). In process step 1352, an anisotropic etch, such as a reactive ion etch (RIE) is performed to form a trench. This is shown in FIG. 5 (see 528). In process step 1354, a pre-amorphous ion (PAI) process is performed to convert the silicon substrate on the interior surface of the trench from crystalline silicon to amorphous silicon. This is shown in FIG. 6. In process step 1356, a node ion implantation is performed to create the buried plate of the capacitor. This is shown in FIG. 7 (see 704).

After process step 1356, the process may then proceed to either process step 1358 (for a MIM capacitor), or directly to process step 1360. In process step 1358, a cathode metal is deposited on the trench interior. This is shown in FIG. 12 (see 1234). In process step 1360, a node dielectric, such as hafnium oxide is deposited on the interior of the trench. This is shown in FIG. 8 (see 808). In process step 1362, the trench is filled with a conductive material. In one embodiment, the trench is filled with polysilicon. In another embodiment, a metal, such as titanium, is used as the conductor fill material. This is shown in FIG. 9 (see 910). In process step 1364, a shallow trench isolation (STI) region is formed around the upper portion of the trench. This is shown in FIG. 11 (see 1112). In process step 1366, cathode and anode contacts are formed to provide an electrical connection to the capacitor. This is shown in FIG. 2 (see 212 and 214). Note that while the examples presented showed the techniques applied to trench capacitors, embodiments of the present invention may also be applicable to other capacitors, such as planar capacitors that utilize an N type or P type implanted well as the bottom plate.

Figure 14:
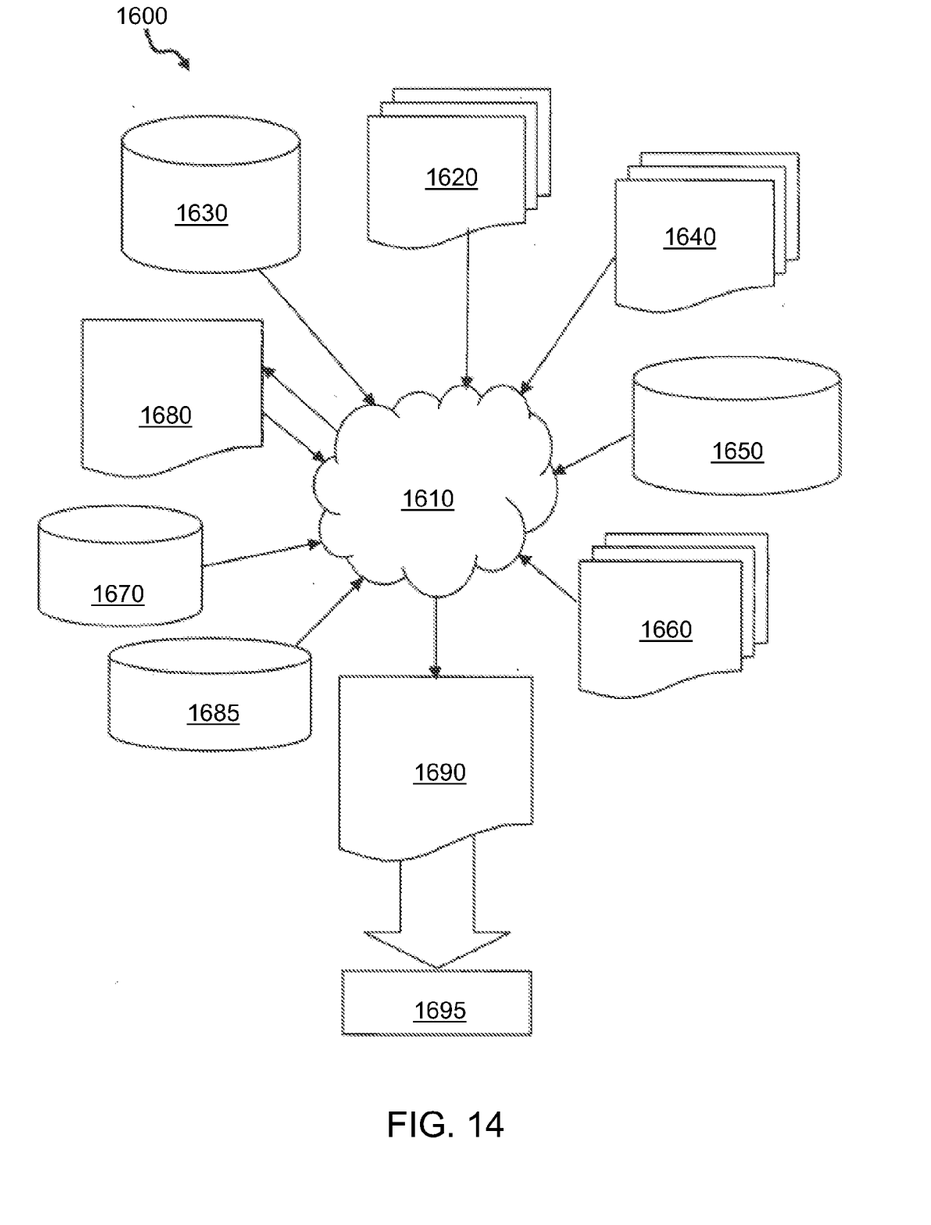
FIG. 14 shows a block diagram of an exemplary design flow.

FIG. 14 shows a block diagram of an exemplary design flow 1600 used for example, in semiconductor IC logic design, simulation, test, layout, and manufacture. Design flow 1600 includes processes, machines and/or mechanisms for processing design structures or devices to generate logically or otherwise functionally equivalent representations of the design structures and/or devices described above and shown in FIGS. 2-13. The design structures processed and/or generated by design flow 1600 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 1600 may vary depending on the type of representation being designed. For example, a design flow 1600 for building an application specific IC (ASIC) may differ from a design flow 1600 for designing a standard component or from a design flow 1600 for instantiating the design into a programmable array, for example a programmable gate array (PGA) or a field programmable gate array (FPGA) offered by Altera® Inc. or Xilinx® Inc.

FIG. 14 illustrates multiple such design structures including an input design structure 1620 that is preferably processed by a design process 1610. Design structure 1620 may be a logical simulation design structure generated and processed by design process 1610 to produce a logically equivalent functional representation of a hardware device. Design structure 1620 may also or alternatively comprise data and/or program instructions that when processed by design process 1610, generate a functional representation of the physical structure of a hardware device. Whether representing functional and/or structural design features, design structure 1620 may be generated using electronic computer-aided design (ECAD) such as implemented by a core developer/designer. When encoded on a machine-readable data transmission, gate array, or storage medium, design structure 1620 may be accessed and processed by one or more hardware and/or software modules within design process 1610 to simulate or otherwise functionally represent an electronic component, circuit, electronic or logic module, apparatus, device, or system such as those shown in FIGS. 2-13. As such, design structure 1620 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 1610 preferably employs and incorporates hardware and/or software modules for synthesizing, translating, or otherwise processing a design/simulation functional equivalent of the components, circuits, devices, or logic structures shown in FIGS. 2-13 to generate a Netlist 1680 which may contain design structures such as design structure 1620. Netlist 1680 may comprise, for example, compiled or otherwise processed data structures representing a list of wires, discrete components, logic gates, control circuits, I/O devices, models, etc. that describes the connections to other elements and circuits in an integrated circuit design. Netlist 1680 may be synthesized using an iterative process in which netlist 1680 is resynthesized one or more times depending on design specifications and parameters for the device. As with other design structure types described herein, netlist 1680 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 1610 may include using a variety of inputs; for example, inputs from library elements 1630 which may house a set of commonly used elements, circuits, and devices, including models, layouts, and symbolic representations, for a given manufacturing technology (e.g., different technology nodes, 32 nm, 45 nm, 90 nm, etc.), design specifications 1640, characterization data 1650, verification data 1660, design rules 1670, and test data files 1685 (which may include test patterns and other testing information). Design process 1610 may further include, for example, standard circuit design processes such as timing analysis, verification, design rule checking, place and route operations, etc. One of ordinary skill in the art of integrated circuit design can appreciate the extent of possible electronic design automation tools and applications used in design process 1610 without deviating from the scope and spirit of the invention. The design structure of the invention is not limited to any specific design flow.

Design process 1610 preferably translates an embodiment of the invention as shown in FIGS. 2-13, along with any additional integrated circuit design or data (if applicable), into a second design structure 1690. Design structure 1690 resides on a storage medium in a data format used for the exchange of layout data of integrated circuits (e.g. information stored in a GDSII (GDS2), GL1, OASIS, or any other suitable format for storing such design structures). Design structure 1690 may comprise information such as, for example, test data files, design content files, manufacturing data, layout parameters, wires, levels of metal, vias, shapes, data for routing through the manufacturing line, and any other data required by a semiconductor manufacturer to produce an embodiment of the invention as described above with reference to FIGS. 2-13. Design structure 1690 may then proceed to a stage 1695 where, for example, design structure 1690: proceeds to tape-out, is released to manufacturing, is released to a mask house, is sent to another design house, is sent back to the customer, etc.

Although the invention has been shown and described with respect to a certain preferred embodiment or embodiments, certain equivalent alterations and modifications will occur to others skilled in the art upon the reading and understanding of this specification and the annexed drawings. In particular regard to the various functions performed by the above described components (assemblies, devices, circuits, etc.) the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more features of the other embodiments as may be desired and advantageous for any given or particular application.

What is claimed is:

1. A method of forming a trench capacitor, comprising:
   forming a trench having an interior surface in a semiconductor substrate;
   performing a pre-amorphous ion process on the interior surface of the trench, including a bottom portion of the interior surface, wherein performing a pre-amorphous ion process on the interior surface of the trench is performed using carbon;
   forming a buried plate on the interior surface of the trench that has been pre-amorphous ion processed;
   depositing a node dielectric along the interior surface of the trench; and
   filling the trench with a conductive material.

2. The method of claim 1, wherein forming a trench having an interior surface in a semiconductor substrate is performed via a reactive ion etch process.

3. The method of claim 1, wherein forming a buried plate is performed via node ion implantation.

4. The method of claim 3, wherein the node ion implantation is performed using a species selected from the group consisting of arsenic and phosphorous.

5. The method of claim 4, wherein forming a buried plate is performed using a dopant concentration ranging from about 1 e18/cm$^3$ to about 1 e20/cm$^3$ and an energy setting ranging from about 5 KeV to about 30 KeV.

6. The method of claim 1, wherein depositing a node dielectric along the interior surface of the trench comprises depositing a layer of hafnium oxide.

7. The method of claim 1, wherein filling the trench with a conductive material comprises filling the trench with polysilicon.

8. The method of claim 1, wherein filling the trench with a conductive material comprises filling the trench with metal.

9. The method of claim 8, wherein filling the trench with metal comprises filling the trench with titanium.

10. The method of claim 1, further comprising forming a shallow trench isolation region around the trench.

11. The method of claim 1, further comprising depositing a metal layer over the buried plate, prior to depositing a node dielectric along the interior of the trench.

* * * * *